(12) United States Patent
Singh et al.

(10) Patent No.: US 7,190,714 B2
(45) Date of Patent: Mar. 13, 2007

(54) PERIPHERAL DEVICE RECEIVER DETECTION IN A HIGH NOISE ENVIRONMENT

(75) Inventors: Prashant Singh, Eden Prairie, MN (US); Donald C. Grillo, Lakeville, MN (US)

(73) Assignee: LSI Logic Corporation, Milpitas, CA (US)

( * ) Notice: Subject to any disclaimer, the term of this patent is extended or adjusted under 35 U.S.C. 154(b) by 812 days.

(21) Appl. No.: 10/328,719

(22) Filed: Dec. 23, 2002

(65) Prior Publication Data

US 2004/0119457 A1    Jun. 24, 2004

(51) Int. Cl.
*H04B 1/38*    (2006.01)

(52) U.S. Cl. .................. 375/219; 324/118

(58) Field of Classification Search ........ 375/219–220, 375/228; 710/305, 313; 370/241; 324/118
See application file for complete search history.

(56) References Cited

U.S. PATENT DOCUMENTS

| | | | |
|---|---|---|---|
| 5,317,697 A | 5/1994 | Husak et al. ............... 395/325 |
| 5,530,302 A | 6/1996 | Hamre et al. .............. 307/147 |
| 5,613,130 A | 3/1997 | Teng et al. ................. 395/750 |
| 5,714,809 A | 2/1998 | Clemo ....................... 307/125 |
| 5,754,797 A | 5/1998 | Takahashi .................. 395/283 |
| 5,768,541 A | 6/1998 | Pan-Ratzlaff .............. 395/283 |
| 5,784,576 A | 7/1998 | Guthrie et al. ............. 395/283 |
| 5,809,256 A | 9/1998 | Najemy ..................... 395/283 |
| 5,951,659 A | 9/1999 | McElroy et al. ........... 710/101 |
| 5,951,660 A | 9/1999 | Van Wonterghem ....... 710/103 |
| 5,973,419 A | 10/1999 | Kruppa et al. ............. 307/131 |
| 5,996,035 A | 11/1999 | Allen et al. ................. 710/103 |
| 6,170,029 B1 | 1/2001 | Kelley et al. ............... 710/103 |
| 6,229,334 B1 | 5/2001 | Kelley et al. ................ 326/30 |
| 6,247,080 B1 | 6/2001 | Wallach et al. ............ 710/103 |
| 6,286,066 B1 | 9/2001 | Hayes et al. ............... 710/103 |
| 6,311,242 B1 | 10/2001 | Falkenburg et al. ....... 710/103 |
| 6,336,591 B1 | 1/2002 | Staples et al. ............. 235/487 |
| 6,353,523 B1 | 3/2002 | Niv et al. .................... 361/79 |
| 6,470,026 B1 | 10/2002 | Pearson et al. ............ 370/463 |
| 6,650,622 B1 * | 11/2003 | Austerman et al. ........ 370/241 |
| 6,690,768 B2 * | 2/2004 | Hansen ..................... 379/1.03 |
| 6,868,468 B2 * | 3/2005 | Boz et al. ................... 710/304 |
| 7,010,640 B2 * | 3/2006 | Hoshino et al. ........... 710/313 |
| 2002/0131220 A1 | 9/2002 | Li ............................... 361/56 |

* cited by examiner

*Primary Examiner*—Khanh Tran
(74) *Attorney, Agent, or Firm*—Westman, Champlin & Kelly P.A.

(57) ABSTRACT

A receiver detector of a peripheral device for use in a computer system to detect whether a receiver is electrically coupled to a data port of the peripheral device includes a modulator, a high pass filter, and a demodulator. The modulator is configured to modulate a receiver detect signal at a frequency that is higher than a noise frequency, below which high amplitude noise can develop. The high pass filter is electrically coupled to the receiver detect signal and is configured to block frequencies of the receiver detect signal that are below the noise frequency and pass a filtered receiver detect signal. The demodulator is configured to demodulate the filtered receiver detect signal and produce a recovered receiver detect signal that is indicative of whether a receiver is electrically coupled to the data port.

19 Claims, 5 Drawing Sheets

PERIPHERAL DEVICE RECEIVER DETECTION IN A HIGH NOISE ENVIRONMENT

FIELD OF THE INVENTION

The present invention is generally related to computer systems utilizing peripheral devices and, more particularly, to peripheral device receiver detection in a high noise environment.

BACKGROUND OF THE INVENTION

Computer systems typically include expansion connectors for the addition of peripheral devices to extend and enhance the function of the computer system. Examples of such peripheral devices include modems, network cards, adapter cards, Compact Discs (CD's), and Digital Video Discs (DVD's) drives, Random Access Memory (RAM), data storage devices, and sound devices. Such peripheral devices are typically formed in accordance with an industry standard specification that governs the physical connection to the computer system through a data port or slot, and the data bus over which communications with the peripheral device are conducted.

Some industry standard specifications allow for the insertion and removal of the peripheral devices while the computer system is running without damaging the computer system or peripheral device. This "hot swapping" of the peripheral device is particularly desirable in computer systems that are required to operate continuously, such as communication network controllers, servers, gateways, routers, and the like. One such industry standard specification is the Peripheral Component Interconnect Express (PCI-X) specification. Like its predecessor, the Peripheral Component Interconnect (PCI) specification, the PCI-X specification enables high-speed communication between compatible peripheral devices and the central processing unit (CPU) of the computer system. In a PCI-X device pair, data is communicated between a transmitter of one PCI-X device and a receiver of another PCI-X device over a transmission line, to which data port terminations of the transmitter and receiver are capacitively coupled.

The hot swapping function accommodated by the PCI-X specification makes it necessary for a transmitter of one PCI-X device to check to determine whether the corresponding receiver of the peripheral device it wishes to communicate with is present. This is accomplished by periodically performing a receiver detect function. The receiver detect function generally involves comparing a voltage at the data port termination of the transmitter to a reference voltage. The corresponding receiver is determined to be present when the voltage at the data port is above the reference voltage after a predetermined period of time.

Additionally, it is necessary to provide protection from electrostatic discharge (ESD) where static charge builds on the transmission line and is discharged through a peripheral device when it is connected to the transmission line. This discharge could be large and could damage the peripheral components. One manner in which ESD protection is provided is by switching the termination of the data port of the transmitter into a high impedance state, once it is determined that the receiver is absent, to reduce the magnitude of the discharge that could occur when the receiver is reconnected. Unfortunately, this ESD protection scheme can give rise to high amplitude noise at the high impedance data port termination of the transmitter, which can interfere with the implementation of the receiver detect function. As a result, false detections of the receiver can occur resulting in data miscommunications.

SUMMARY

The present invention provides a solution to the problem of performing receiver detection in a high noise environment. One aspect of the present invention is directed to a receiver detector of a peripheral device for use in a computer system to detect whether a receiver is electrically coupled to a data port of the peripheral device. The receiver detector includes a modulator, a high pass filter, and a demodulator. The modulator is configured to modulate a receiver detect signal at a frequency that is higher than a noise frequency, below which high amplitude noise can develop. The high pass filter is electrically coupled to the receiver detect signal and is configured to block frequencies of the receiver detect signal that are below the noise frequency and pass a filtered receiver detect signal. The demodulator is configured to demodulate the filtered receiver detect signal and includes a recovered receiver detect signal that is indicative of whether a receiver is electrically coupled to the data port.

Another aspect of the invention is directed to a peripheral device that includes a data port having high and low impedance terminations, a transmitter, and the receiver detector described above.

Yet another aspect of the invention is directed to a method of detecting an electrical connection between a data port of a transmitter of a peripheral device to a receiver when the data port is in a high impedance operating mode. Initially, a receiver detect signal is generated a the data port. Next, the receiver detect signal is modulated at a frequency that is higher than a noise frequency, below which high amplitude noise can develop at the data port. Frequencies of the receiver detect signal that are below the noise frequency are then blocked and a filtered receiver detect signal is passed. Finally, the filtered receiver detect signal is demodulated to produce a recovered receiver detect signal that is indicative of whether a receiver is electrically coupled to the data port.

Other features and benefits that characterize embodiments of the present invention will be apparent upon reading the following detailed description and review of the associated drawings.

DETAILED DESCRIPTION OF THE PREFERRED EMBODIMENTS

Figure 1:
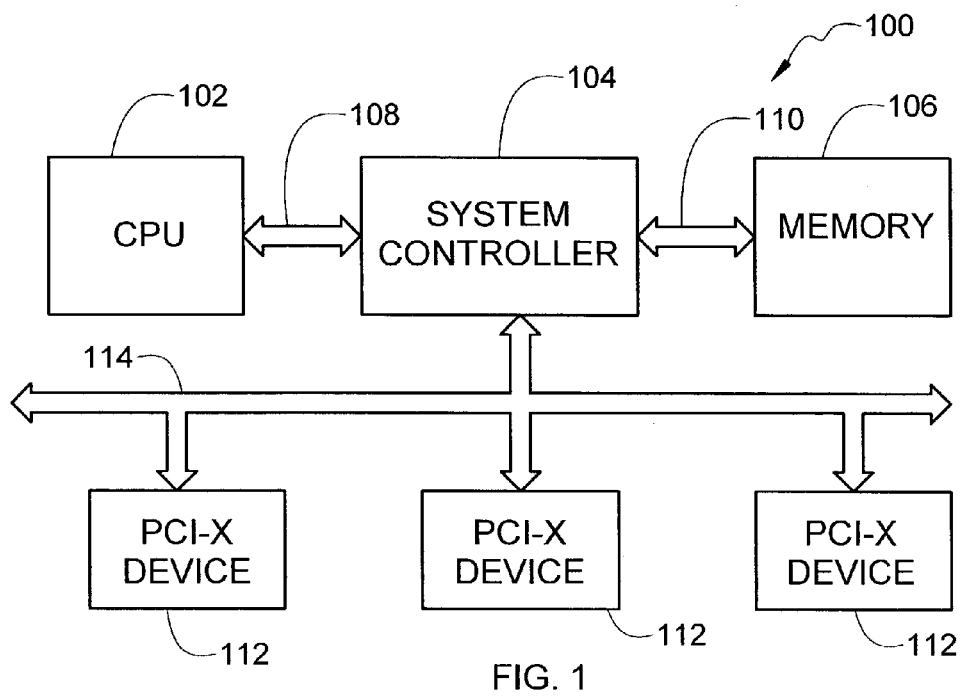
FIG. 1 is a schematic diagram of a computer system with which embodiments of the present invention may be used.

FIG. 1 is a schematic diagram of a computer system 100 that is configured to operate in accordance with the Peripheral Component Interconnect Express (PCI-X) specification. Computer system 100 includes a CPU 102, a system controller 104, and system memory 106. The CPU 102 is linked to the system controller 104 by a high-speed CPU bus 108. The system controller 104 is, in turn, linked to the system memory 106 through a memory bus 110. Computer system 100 also includes various peripheral devices 112 in accordance with the present invention that are linked to the system controller 104 through a bus 114. The peripheral devices 112 and the bus 114 are preferably formed in accordance with the PCI-X specification. Additional bus architectures such as a slower Industry Standard Architecture (ISA) and a Small Computer Systems Interface (SCSI) bus architecture (not shown) can also be used in the computer system 100.

PCI-X devices 112 are typically high-speed and high bandwidth input and output devices, such as modems, network cards, adapter cards, Compact Disc (CD), and Digital Video Disc (DVD) drives, Random Access Memory (RAM), data storage devices, and sound devices. The CPU 102 of computer system 100 communicates with the PCI-X devices 112 through the system controller 104. Additionally, the PCI-X devices 112 can communicate with each other over transmission lines that form the PCI-X bus 114.

Figure 2:
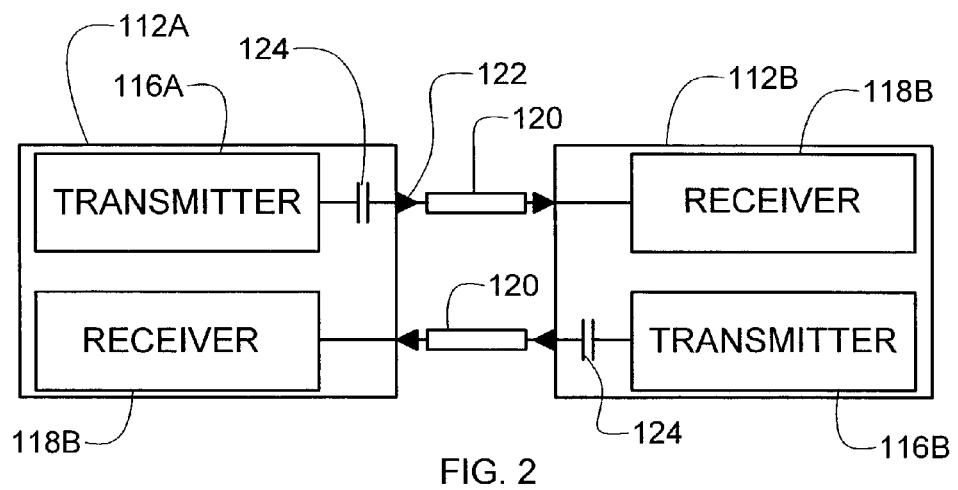
FIG. 2 is a schematic diagram of a peripheral device pair.

PCI-X devices 112 can include both a transmitter 116 and a receiver 118, as shown in the schematic diagram of FIG. 2 depicting a PCI-X peripheral device pair 112A and 112B. Data is communicated between the transmitter 116A of device 112A and a receiver 118B of another device 112B over a transmission line 120. The transmitter 116A is capacitively coupled to the transmission line 120 through a capacitor 124 (e.g., 100 nF) at the data port termination 122, in accordance with the PCI-X specification.

Figure 3:
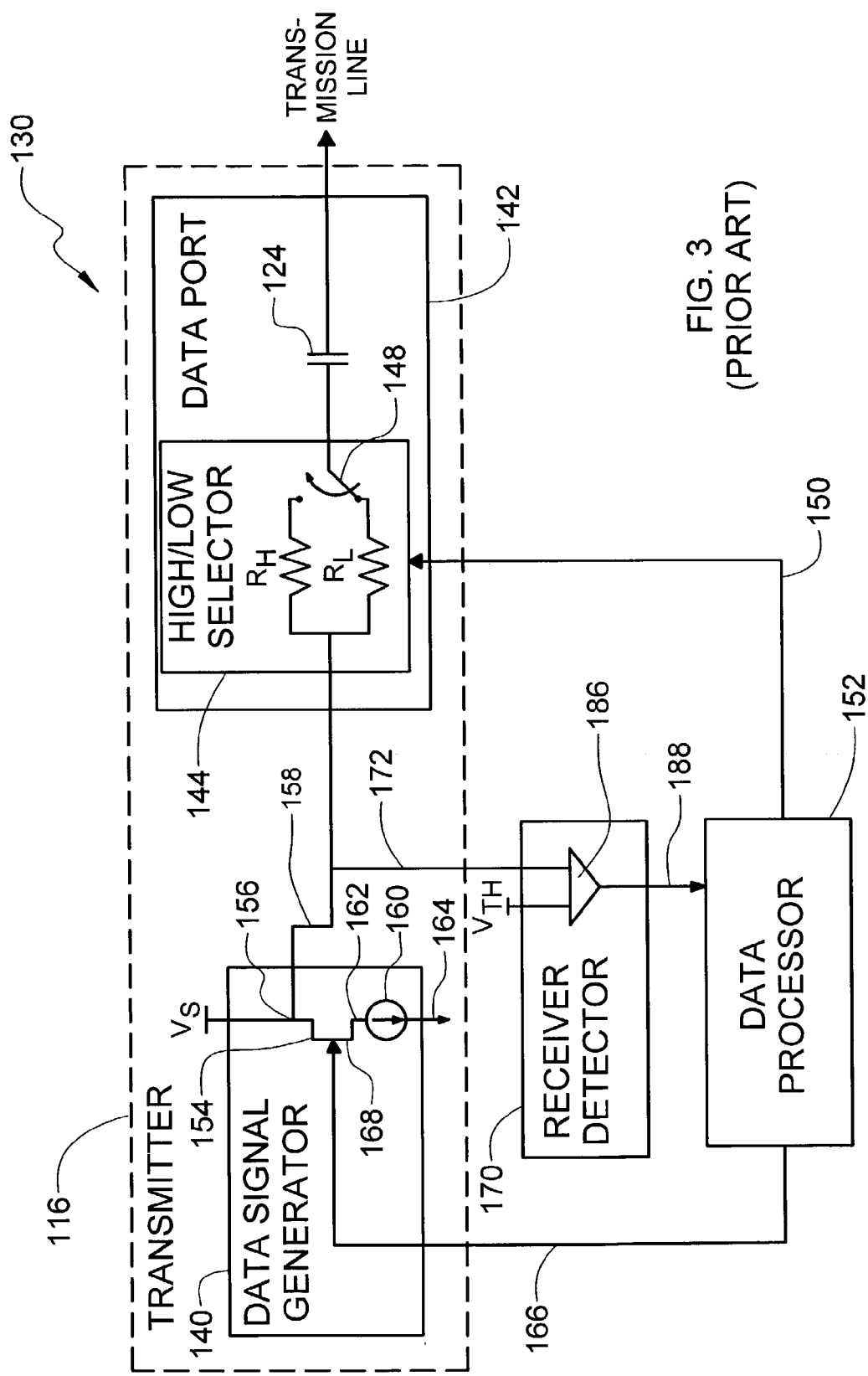
FIG. 3 is a schematic diagram of a peripheral device in accordance with the prior art.

FIG. 3 is a schematic diagram depicting a PCI-X device 130 in accordance with the prior art. Only the transmitter 116 and related components are depicted to simplify the figure and the discussion of the device 130. The transmitter 116 includes a data signal generator 140 and a data port 142 that is adapted to couple to the transmission line 120 (FIG. 2) for communication with a corresponding receiver 118 of another PCI-X device 112.

The data signal generator 140 generally includes a transistor 154 having an output terminal 156 coupled to a supply voltage $V_S$ and to a high/low impedance termination selector 144 through line 158. A current source 160 is placed between a transistor terminal 162 and a common voltage 164 to bias the transistor 154 into the active region. The data processor 152 controls the data signal generator 140 using a data control signal 166 that is electrically coupled to the gate 168 of the transistor 154. The data signal generator 140, in response to the data control signal 166, produces data signals on line 158 in the form of a voltage ranging from the supply voltage $V_S$ (typically 1.2 volts) and the common voltage 164 (0 volts) in accordance with known methods.

The data port 142 includes a capacitor 146 (e.g., 100 nF), which capacitively couples transmitter 116 to transmission line 120. High/low impedance termination selector 144 selectively electrically couples the data signal generator 140 to the transmission line 120 through a high impedance termination $R_H$ (e.g., greater than 5 kilo-ohms) when in a high impedance operating mode, and electrically couples the data signal generator 140 to the transmission line 120 through a low impedance termination $R_L$ (e.g., 50 or 75 ohms) when the transmitter 116 is in a low impedance operating mode. The selection between the high and low operating modes is made by a switch 148 that is under control of an impedance mode signal 150 from the data processor 152.

During normal communication between the transmitter 116 and a corresponding receiver coupled to the transmission line 120, the data processor 152 places the transmitter 116 in the low impedance operating mode. The low impedance termination $R_L$ matches the impedance of the data port termination 122 of the receiver 118 of the corresponding PCI-X device for low signal loss communication there between, in accordance with the PCI-X specification.

Due to the hot swapping capability of the device 130, transmitter 116 must periodically perform a receiver detect function to ensure that the receiver 118 of the device it wishes to communicate with is present or attached to the transmission line 120 to prevent data miscommunication therebetween. The receiver detect function is generally performed by a receiver detector 170. In general, the receiver detect function of the prior art involves monitoring a voltage of a receiver detect signal at line 158 through line 172 following a resetting of the data signal generator 140. The data processor 152 can control the resetting of the data signal generator 140 and the generation of the receiver detect signal in a variety of ways. One method is to terminate data communication and turn off the current source 160.

Figure 4:
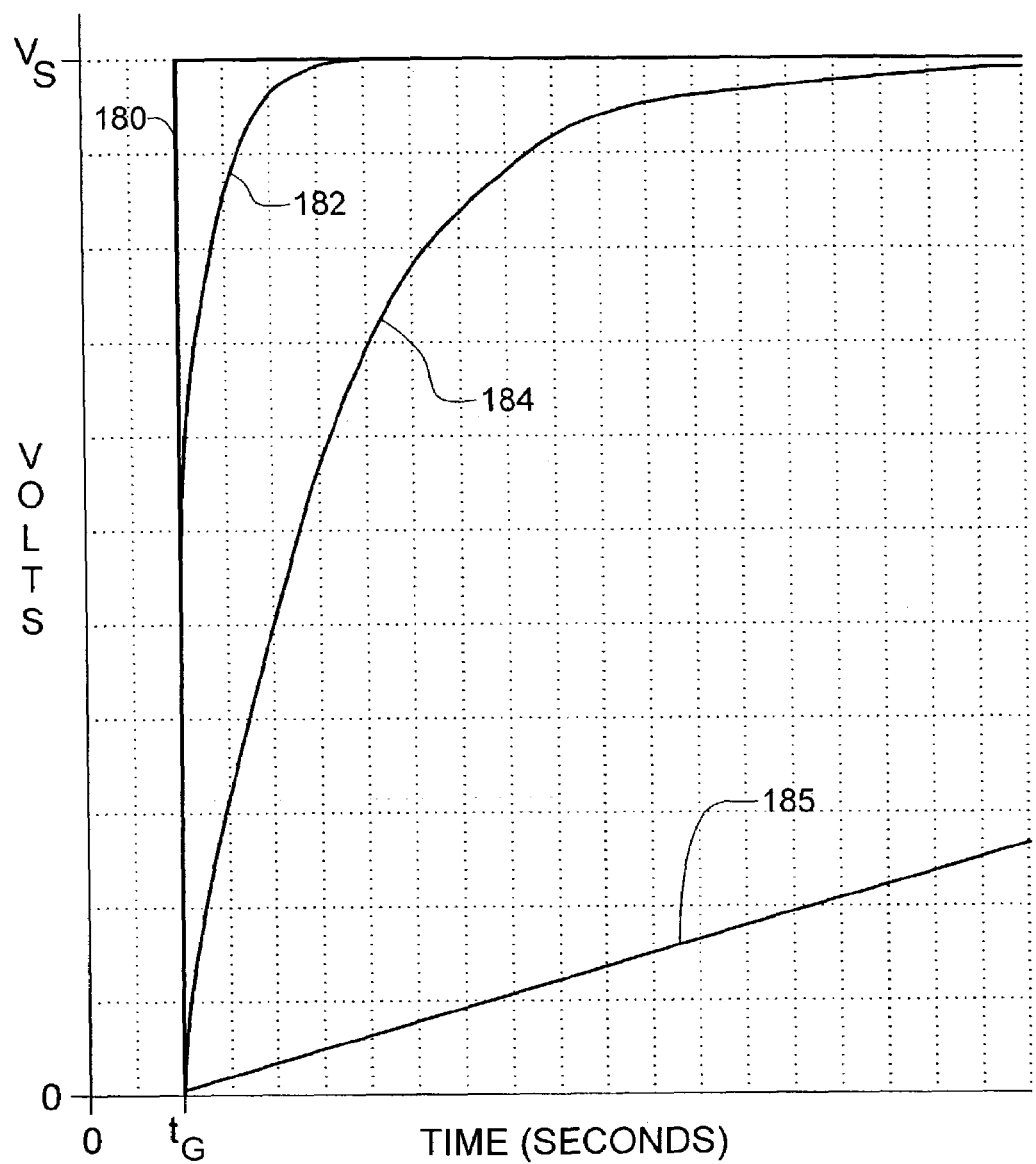
FIG. 4 is a chart illustrating the behavior of a voltage at a data port of a transmitter of a peripheral device in accordance with various configurations.

FIG. 4 is a chart illustrating the behavior of the receiver detect signal at line 158 over time following the resetting of the data signal generator 140 in accordance with various configurations. Lines 180 and 182 respectively represent the receiver detect signal when a receiver 118 is disconnected and connected to the transmission line 120 and when the transmitter 116 is in the low impedance operating mode. Lines 184 and 185 respectively represent the receiver detect signal when a receiver 118 is disconnected and connected to the transmission line 120 and when the transmitter 116 is in the high impedance operating mode. Clearly, the receiver detect signal rises more quickly to the supply voltage $V_S$ when the corresponding receiver 118 is absent or disconnected from the transmission line 120.

The receiver detect function or method performed by the receiver detector 170 determines whether the receiver 118 is present or absent by determining whether the receiver detect signal has a voltage that is greater than a threshold voltage $V_{TH}$ after a predetermined period of time T has expired following the generation of the receiver detect signal at a time $t_G$ (FIG. 4). The threshold voltage $V_{TH}$ and the time T are selected such that the voltage at the output terminal 156 or line 158 after the expiration of the time T, is determinative of whether the receiver 118 is present or absent. For example, after the time T has expired, it is known that the receiver 118 is absent when the voltage of the receiver detect signal is greater than the threshold voltage $V_{TH}$, and it is known that the receiver 118 is present when the voltage of the receiver detect signal is less than the threshold voltage $V_{TH}$. This function is performed by a comparator 186 that provides an output signal 188 to the data processor 152 that is indicative of the result of the comparison of the threshold voltage $V_{TH}$ and the voltage at line 158, as shown in FIG. 3. The data processor 152 can then use the output signal 188 to determine whether data communications should proceed.

When it is determined that the receiver 118 is present, the transmitter 116 can resume data communication therewith while operating in the low impedance mode. On the other hand, if it is determined that the receiver 118 is absent, the transmitter 116 is placed in the high impedance operating mode. The device 130 then periodically performs the receiver detect function using receiver detector 170 to determine whether a receiver 118 becomes connected to the transmission line 120.

The purpose of placing transmitter 116 in the high impedance operating mode is to protect a receiver 118 from electrostatic discharge (ESD) when it is connected to the transmission line 120. The receivers of PCI-X devices generally include transistors having extremely thin oxide and insulating layers that can be easily damaged by receiving relatively small currents driven by a moderate voltage, such as that produced by electrostatic charge that accumulates on the transmission line 120 while the receiver 118 is absent. Without proper protection, the electrostatic charge on the transmission line 120 could discharge through a susceptible electronic component when the receiver 118 of the peripheral device is reconnected to the transmission line 120. The high impedance operating mode of the transmitter 116 slows the discharge of the electrostatic charge through the receiver 118 to a safe rate (low current) when it is reconnected to the transmission line 120, such that damage to the delicate electronics of the receiver 118 is avoided.

Unfortunately, this ESD protection scheme has a key shortcoming. The placement of the transmitter 116 in the high impedance operating mode when the receiver 118 is absent, results in the transmission line 120 having a high impedance termination at the transmitter 116 and an open circuit at the disconnected end. This causes the transmission line 120 to behave like a lightly damped RLC tank circuit, which is susceptible to resonant coupling of noise therein.

Figure 5:
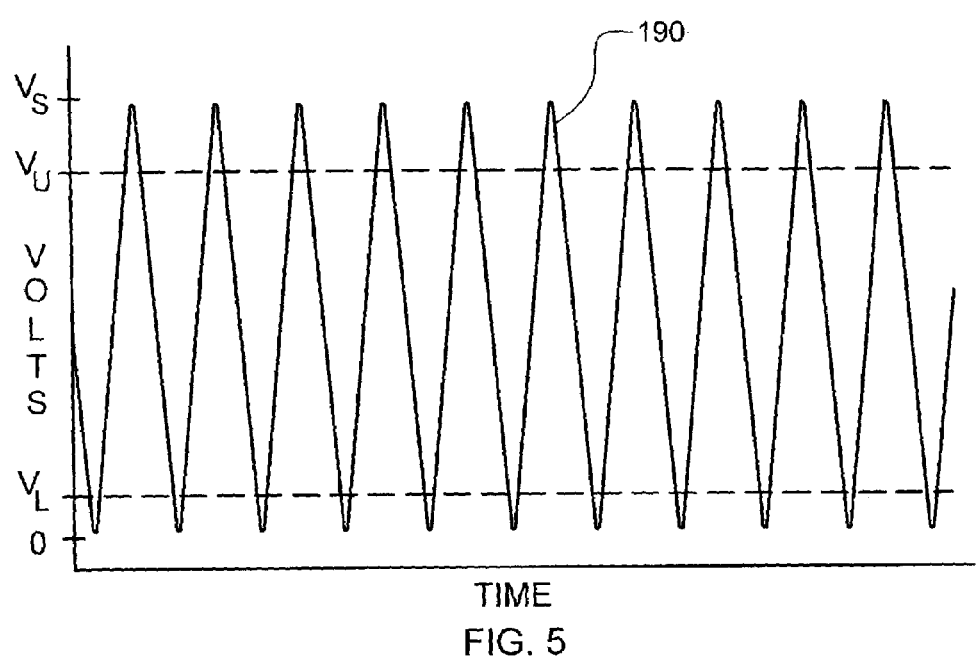
FIG. 5 is a chart illustrating an example of rail-to-rail noise at a data port of a transmitter of a peripheral device when operating in a high impedance mode and when a corresponding transmitter is absent.

Noise coupling at a resonant or noise frequency (e.g., approximately 200 MHz) of the tank circuit can give rise to high amplitude noise at the high impedance data port termination (line 158) of the transmitter 116, an example of which is illustrated by line 190 in the chart of FIG. 5. The resonantly coupled noise, or rail-to-rail noise, at the data port 142 generally includes high frequency electrical signals having maximum and minimum voltages that respectively substantially correspond to proximate a high rail voltage corresponding to the supply voltage $V_S$ (e.g., 1.2 volts), and a low rail voltage corresponding to the voltage common 164 (0 volts). Such noise can interfere with the implementation of the receiver detect function performed by the receiver detector 170 of the prior art. As a result, false detections of the receiver 118 can occur resulting in data miscommunications.

Figure 6:
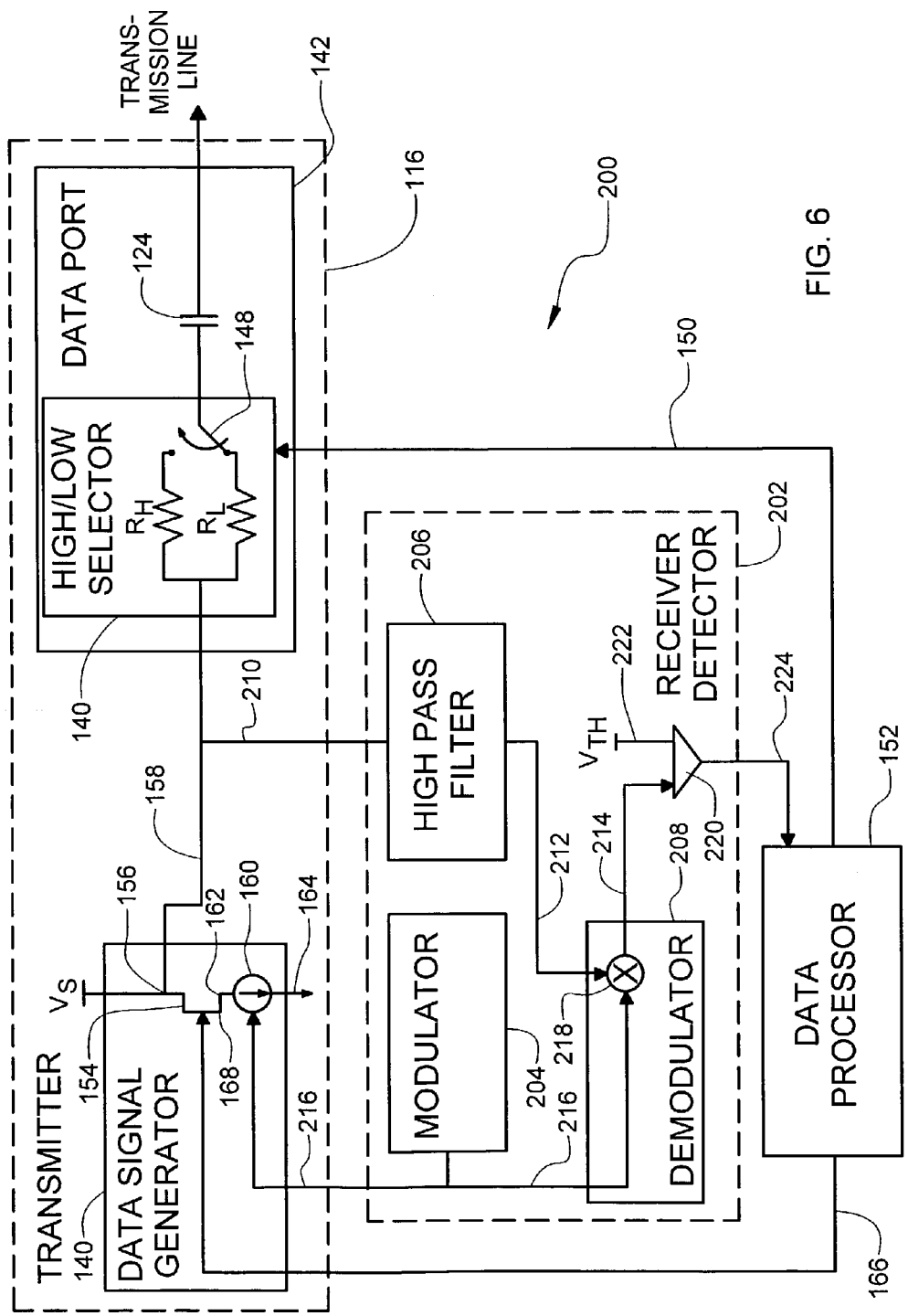
FIG. 6 is a schematic diagram illustrating a peripheral device in accordance with embodiments of the invention.

The peripheral device of the present invention can perform a receiver detect function even in the presence of high amplitude noise at the data port termination of the transmitter 116. FIG. 6 is a schematic diagram of a peripheral device 200 in accordance with embodiments of the invention. The receiver and other electronic components of device 200 are not shown to simplify the illustration and the discussion of the invention. Peripheral device 200 is preferably formed in accordance with the PCI-X specification and includes a transmitter 116 having a data signal generator 140, a data port 142, and a data processor 152 that substantially operate in the manner discussed above.

Peripheral device 200 also includes a receiver detector 202 that allows for the detection of a receiver 118 coupled to the transmission line 120 even in the presence of high amplitude or rail-to-rail noise at the data port 142 (i.e., the high impedance termination $R_H$ or at line 158). The receiver detector 202 performs a receiver detect function following the resetting of the data signal generator 140 by the data processor 152, through analysis of the voltage at the data port 142.

The receiver detector 202 generally includes a modulator 204, a high pass filter 206, and a demodulator 208. The modulator 204 is configured to modulate the receiver detect signal, generated on line 158 by the data signal generator 140, at a frequency that is higher than the noise frequency, below which high amplitude (i.e., rail-to-rail) noise can develop at the data port 142. The high pass filter is electrically coupled to the receiver detect signal through line 210 and is configured to block frequencies of the receiver detect signal that are below the noise frequency and pass a filtered detect signal 212. The demodulator 208 is configured to demodulate the filtered receiver detect signal 212 and produce a recovered receiver detect signal 214 that is substantially free of rail-to-rail noise and is indicative of whether a receiver 118 is electrically coupled to the data port 142 through transmission line 120.

The modulator produces a dithered output signal 216 that controls the operation of the current source 160. The current source 160 is preferably a voltage controlled current source and the dithered output signal 216 is preferably a voltage signal that turns the current source 160 on and off at a frequency that exceeds the noise frequency (e.g., greater than 200 MHz). The purpose of modulating or dithering the current source 160 is to modulate the receiver detect signal outside the expected noise frequency of rail-to-rail noise that is produced at the data port 142 as a result of the transmitter 116 operating in the high-impedance mode when a corresponding receiver 118 is absent or disconnected from the transmission line 120. This modulation of the receiver detect signal requires a modification to manner in which the data signal generator 140 is reset by the data processor 152. In general, after pulling the voltage at the output terminal 156 to proximate the voltage common 164, the data processor 152 maintains the transistor 154 in a slightly open condition while the current source 160 is dithered on and off. This results in the combination of the dithered current signal with the standard receiver detect signal discussed above at the output terminal 156 of the transistor 154.

The high pass filter 206 receives the receiver detect signal that has been modulated or dithered through line 210, as discussed above. A cut-off frequency of the high pass filter 206 is selected to eliminate or block frequencies of the receiver detect signal that correspond to the frequencies of rail-to-rail noise that could potentially develop at the data port 242. Accordingly, the cut-off frequency of the high pass filter 206 is selected to be at least slightly higher than the noise frequency of the anticipated rail-to-rail noise. As a result, the high pass filter 206 blocks the passage of the rail-to-rail noise and passes the filtered receiver detect signal 214 that is substantially free of rail-to-rail noise.

The demodulator 208 receives the filtered receiver detect signal 212 from the high pass filter 206, and the dithered signal 216 from the modulator 204. A mixer 218 of the demodulator 208 mixes the filtered receiver detect signal 212 and the dithered signal 216 to produce the recovered receiver detect signal 214. The recovered receiver detect signal 214 substantially corresponds to the receiver detect signal discussed above with reference to FIG. 4, which is indicative of whether a termination of the corresponding receiver 118 is connected to the transmission line 120.

One embodiment of the receiver detector 202 includes a comparator 220 that is configured to compare the recovered receiver detect signal 214 to a reference signal 222, which is preferably a threshold voltage $V_{TH}$. The comparator 220 is further adapted to produce an output signal 224 in response to the comparison of the recovered receiver detect signal 214 and the reference signal 220. As discussed above, the output signal 224 can be used to determine whether a corresponding receiver 118 is present or absent by analyzing the output signal 224 after a predetermined period of time T has elapsed from the generation of the receiver detect signal.

It is to be understood that even though numerous characteristics and advantages of various embodiments of the invention have been set forth in the foregoing description, together with the details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. Thus, the particular elements may vary depending on the particular application for the invention while maintaining substantially the same functionality and without departing from the scope and spirit of the invention. For example, the manner in which the method of the invention is implemented can take on many different forms including different circuit configurations. Additionally, a particular location at which the receiver detect signal is analyzed to perform the receiver detect function can vary from that specified above.

What is claimed is:

1. A peripheral device for use in a computer system and including a data port, the device comprising:
    a data signal generator configured to generate a receiver detect signal that is modulated at a frequency that is higher than a noise frequency, below which high amplitude noise can develop;
    a high pass filter electrically coupled to the receiver detect signal and configured to block frequencies of the receiver detect signal that are below the noise frequency and pass a filtered receiver detect signal; and
    a demodulator configured to demodulate the filtered receiver detect signal, the demodulator having a recovered receiver detect signal that is indicative of whether a receiver is electrically coupled to the data port.

2. The device of claim 1, wherein:
    the device further comprises a modulator configured to generate a dithered output signal that controls the modulation of the receiver detect signal; and
    the demodulator is electrically coupled to the dithered output signal and demodulates the filtered receiver detect signal using the dithered output signal.

3. The device of claim 1, further comprising a comparator having an output signal that is produced in response to a comparison between the recovered receiver detect signal and a reference signal.

4. The device of claim 1, wherein the noise frequency is less than 200 MHz.

5. A peripheral device for use in a computer system comprising:
    a data port having high and low impedance terminations;
    a transmitter having a data signal generator electrically coupled to the low impedance termination when in a low impedance operating mode, and electrically coupled to the high impedance termination when in a high impedance operating mode, and configured to generate receiver detect signal that is modulated at a frequency that is higher than a noise frequency, below which high amplitude noise can develop at the data port; and
    a receiver detector including:
        a high pass filter electrically coupled to the data port and configured to block frequencies of the receiver detect signal that are below the noise frequency and pass a filtered receiver detect signal; and
        a demodulator configured to demodulate the filtered receiver detect signal, the demodulator having recovered receiver detect signal that is indicative of whether a receiver is electrically coupled to the data port.

6. The device of claim 5, wherein:
    the receiver detector further comprises a modulator configured to produce a dithered output signal;
    the data signal generator modulates the receiver detect signal in accordance with the dithered output signal; and
    the demodulator receives the dithered output signal and demodulates the filtered receiver detect signal using the dithered output signal.

7. The device of claim 6, wherein the data signal generator includes a current source that is controlled by the dithered output signal.

8. The device of claim 5 including a data processor having a data control signal that controls the production of the receiver detect signal, and an impedance mode signal that selects either the low or the high impedance operating mode of the transmitter.

9. The device of claim 5, wherein the receiver detector includes a comparator adapted to produce an output signal in response to a comparison between the recovered receiver detect signal and a reference signal.

10. The device of claim 5, wherein an impedance of the low impedance line is approximately 50 ohms.

11. The device of claim 5, wherein an impedance of the high impedance line is more than approximately 10 kilo-ohms.

12. The device of claim 5, wherein the noise frequency is less than 200 MHz.

13. The device of claim 5, wherein the peripheral device is formed in accordance with a peripheral component interconnect express (PCI-X) standard.

14. The device of claim 5, wherein the peripheral device includes a receiver.

15. The device of claim 5, wherein the peripheral device is formed as a compact disc (CD) player and/or recorder, a digital video disc (DVD) player and/or recorder, a disc drive, or a modem.

16. A computer system comprising:
    a central processing unit;
    a system controller in electrical communication with the central processing unit;
    a PCI bus in electrical communication with the system controller; and
    the peripheral device of claim 11, wherein the data processor is electrically coupled to the system controller through the PCI bus.

17. In a computer system, a method of detecting an electrical connection between a data port of a transmitter of a peripheral device to a receiver when the data port is in a high impedance operating mode, the method comprising:
    generating a receiver detect signal at the data port that is modulated at a frequency that is higher than a noise frequency, below which high amplitude noise can develop at the data port;
    blocking frequencies of the receiver detect signal that are below the noise frequency to thereby pass a filtered receiver detect signal; and
    demodulating the filtered receiver detect signal to produce a recovered receiver detect signal that is indicative of whether a receiver is electrically coupled to the data port.

18. The method of claim 17, including: comparing the filtered receiver detect signal to a reference signal and producing an output signal in response thereto.

19. The method of claim 18, wherein the reference signal is a reference voltage.

* * * * *